United States Patent [19]

Mistry

[11] Patent Number: 5,021,853
[45] Date of Patent: Jun. 4, 1991

[54] N-CHANNEL CLAMP FOR ESD PROTECTION IN SELF-ALIGNED SILICIDED CMOS PROCESS

[75] Inventor: Kaizad R. Mistry, Brighton, Mass.

[73] Assignee: Digital Equipment Corporation, Maynard, Mass.

[21] Appl. No.: 515,853

[22] Filed: Apr. 27, 1990

[51] Int. Cl.⁵ .................. H01L 29/06; H01L 29/78; H01L 27/02; H01L 29/04

[52] U.S. Cl. ................... 357/23.13; 357/23.9; 357/42; 357/59; 307/448

[58] Field of Search ................ 357/23.13, 41, 42; 307/304, 448

[56] References Cited

U.S. PATENT DOCUMENTS

| | | | |
|---|---|---|---|
| 4,616,243 | 10/1986 | Minato et al. | 357/42 |
| 4,760,433 | 7/1988 | Young et al. | 357/23.13 |
| 4,825,280 | 4/1989 | Chen et al. | 357/23.13 |
| 4,855,620 | 8/1989 | Duvvury et al. | 357/23.13 |
| 4,907,048 | 3/1990 | Huang | 357/41 |
| 4,949,136 | 8/1990 | Jain | 357/42 |

FOREIGN PATENT DOCUMENTS

| | | | |
|---|---|---|---|
| 61-137358 | 6/1986 | Japan | 357/23.13 |
| 62-20376 | 1/1987 | Japan | 357/23.13 |

Primary Examiner—William D. Larkins
Assistant Examiner—Cynthia S. Deal
Attorney, Agent, or Firm—Arnold, White & Durkee

[57] ABSTRACT

An ESD protection device is formed in an integrated circuit by an N-channel grounded-gate transistor. This protection device has a polysilicon gate, just as other P- and N-channel transistors in the integrated circuit device, but the siliciding of the protection device is controlled so that adverse effects of ESD events are minimized. There are no silicide areas created on top of the polysilicon gate of the protection device, nor on the source/drain regions near the gate and self-aligned with the gate, as there is for other transistors made by the CMOS process. The siliciding of the protection transistor near the gate is prevented by using a deposited oxide layer as a mask, and this oxide layer is also used to create sidewall spacers for the transistor gates. The sidewall spacers are used in creating self-aligned silicided areas over the source/drain regions, self-aligned with the gates, for all P- and N-channel transistors except the protection transistors. A standard process for making CMOS integrated circuits having self-aligned silicided source/drain areas may be used, with the addition of only one non-critical masking step to block the siliciding of protection transistors.

9 Claims, 7 Drawing Sheets

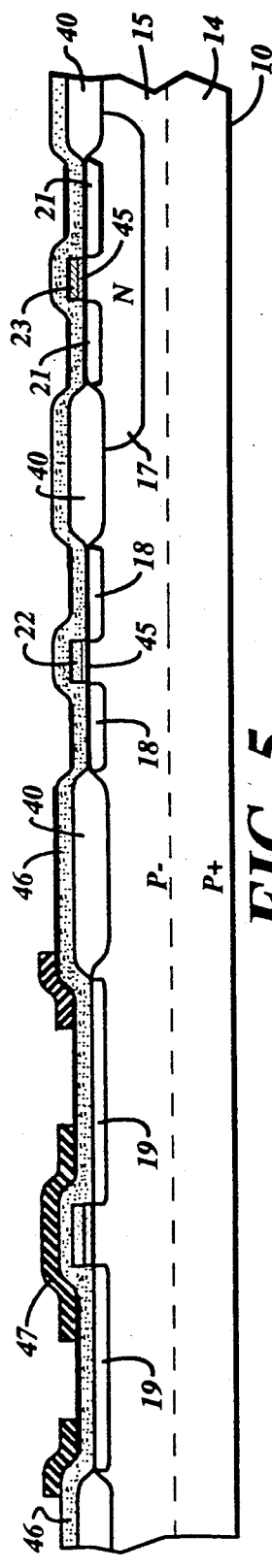
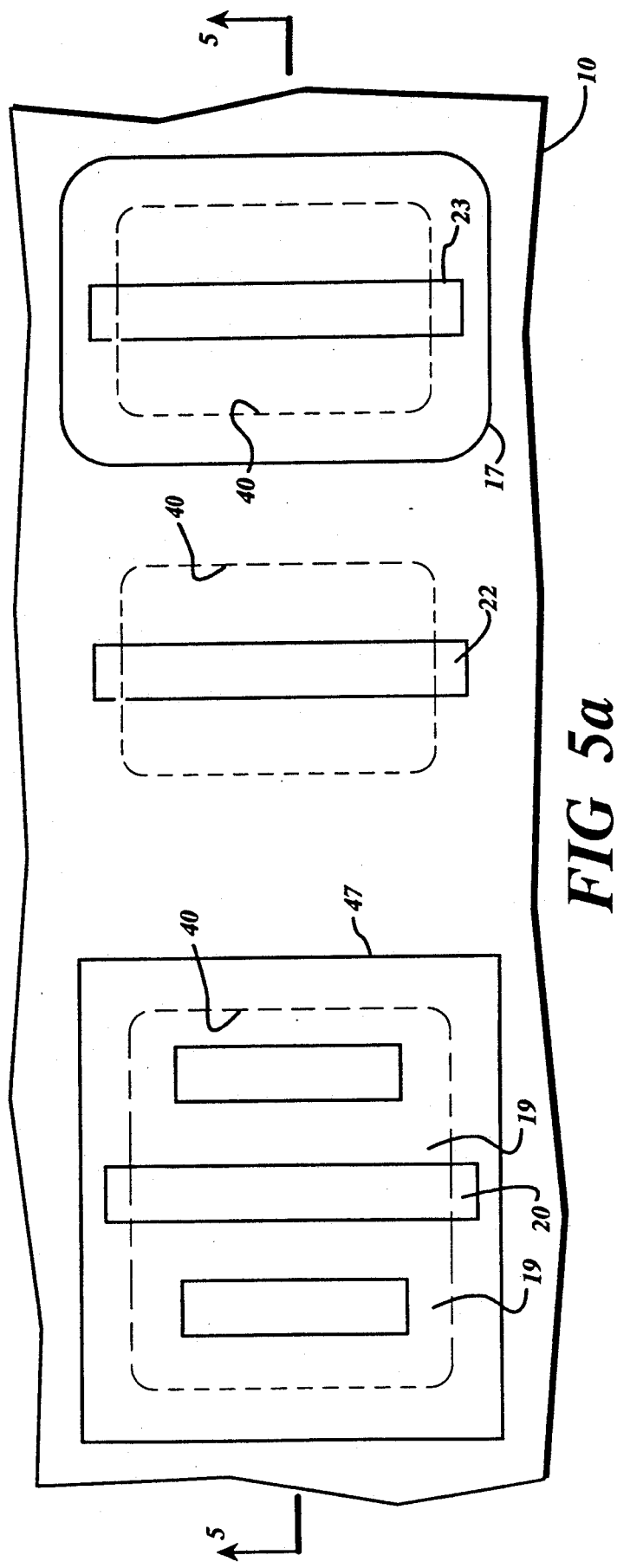
FIG 5
FIG 5a

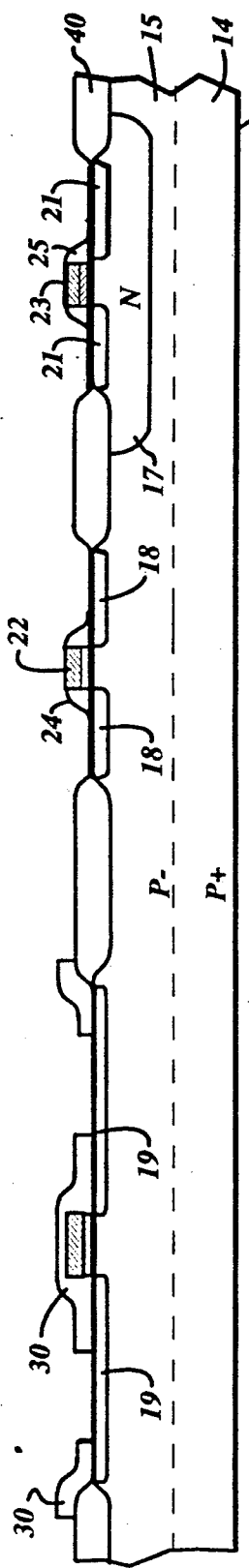
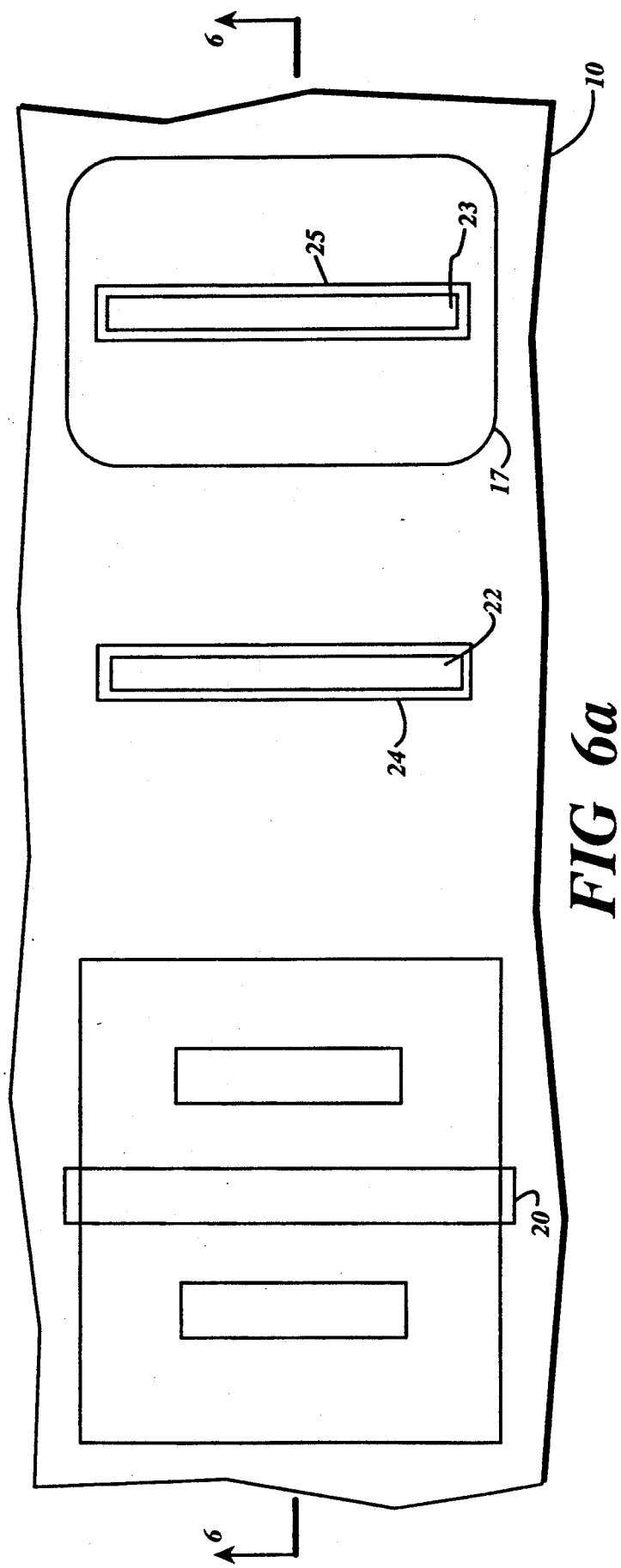
FIG 6
FIG 6a 5,021,853

N-CHANNEL CLAMP FOR ESD PROTECTION IN SELF-ALIGNED SILICIDED CMOS PROCESS

BACKGROUND OF THE INVENTION

This invention relates to semiconductor devices, and more particularly to a method of forming electro-static discharge protection devices in a manner compatible with a self-aligned silicided CMOS process for making integrated circuits.

Electrostatic discharge (ESD) can cause failure of an MOS integrated circuit device by overheating various components due to overcurrent, or due to breakdown of thin oxide, or due to other mechanisms. The output buffers or other I/O nodes of an MOS integrated circuit can be self protecting against ESD failures. During an ESD event, the injected current causes the N-channel MOS pull-down transistor of the output driver to enter snap-back, a low resistance regime that can conduct large amounts of current. But the use of silicided source/drain areas and silicided gates in MOSFETs, particularly LDD (lightly-doped drain) MOSFETs have had a deleterious effect on the self-protection tendency in MOS integrated circuits. Further, it has been shown that for very thin dielectrics, output nodes may be self-protecting from catastrophic damage, but may be weakened by ESD so that their current drive capability is more quickly reduced over time, so that long-term reliability is decreased.

In particular, self-aligned silicided areas pose a problem in MOS integrated circuits because the conducting contact (the silicide) to the reverse-biased junction (the drain of the MOS transistor in snap-back) is very close to the junction edge, which is the source of heat when an ESD event occurs. This causes the silicide to melt, or agglomerate, causing a failure. Another reason why silicides can reduce reliability is that the source/drain series resistance is severely reduced, meaning that there is less of a "ballasting" effect, and current during an ESD event is more easily able to collapse into a thin filament, leading to more heating and early failure.

Nevertheless, siliciding, which reduces resistance, is required for output driver transistors for performance reasons in many circuits. Attempts to minimize the deleterious effects of silicide on the ESD devices in such circuits by layout and device design have not been entirely successful, nor have they generally been applicable to many circuit configurations. These attempts have not addressed the problem of reduction in long term reliability associated with thin dielectrics. One such attempt employed the well junctions for the source and drain regions of the protection device using the field oxide for the gate dielectric, which moves the silicide away from the edge of the deep well junction, but such a device is difficult to trigger into snapback, and its snapback voltage may be larger than that of the pull-down device, so that it does not protect it. Accordingly, a requirement is that the protection device still have the necessary electrical characteristics to perform its function as needed.

SUMMARY OF THE INVENTION

In accordance with one embodiment of the invention, an ESD protection device is formed in an integrated circuit by an N-channel grounded-gate transistor. This protection device has a polysilicon gate, just as other P- and N-channel transistors in the integrated circuit device, but the siliciding of the protection device is controlled so that adverse effects of ESD events are minimized. There are no silicide areas created on top of the polysilicon gate of the protection device, nor on the source/drain regions near the gate and self-aligned with the gate, in contrast to the siliciding of other transistors made by the CMOS process. The siliciding of the protection transistor near the gate is prevented by using a deposited oxide layer as a mask, and this oxide layer is also used to create sidewall spacers for the transistor gates. The sidewall spacers are used in creating self-aligned silicided areas over the source/drain regions, self-aligned with the gates, for all P- and N-channel transistors except the protection transistors. A standard process for making CMOS integrated circuits having self-aligned silicided source/drain areas may be used, with the addition of only one non-critical masking step to block the siliciding of protection transistors.

The blocking of self-aligned siliciding of the source/drain areas means that the silicide will be spaced away from the heat-generating region at the drain junction, and so damage will be lessened. In the standard process, the edge of the silicide would be only a spacer width away from the heat source. Further, as described below, the ESD protection transistor is used in the grounded gate mode, so that long-term reduction in driving current is of no consequence.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

FIG. 2 is an elevation view in section of a small part of a semiconductor integrated circuit containing an ESD protection transistor according to the embodiment of the invention of FIG. 1, taken along the line 2—2 of FIG. 2a;

FIGS. 3, 4, 5, 6 and 7 are elevation views in section of the device of FIGS. 2 and 2a at intermediate stages in the manufacture of an ESD protection transistor according to one embodiment of the invention;

FIGS. 5a, 6a and 7a are plan views of the device of FIGS. 5, 6 and 7, respectively.

DETAILED DESCRIPTION OF SPECIFIC EMBODIMENT

Figure 1:
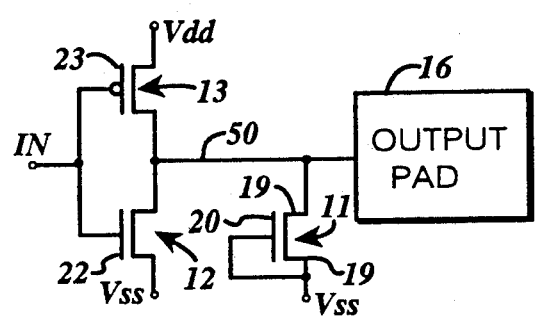
FIG. 1 is an electrical schematic diagram of an output buffer circuit employing an ESD protection transistor made according to one embodiment of the invention.
Figure 2:
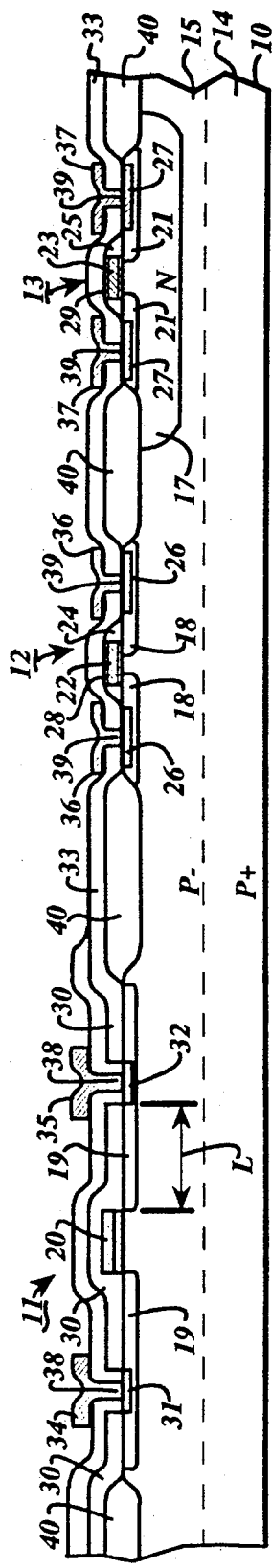
Figure 2A:
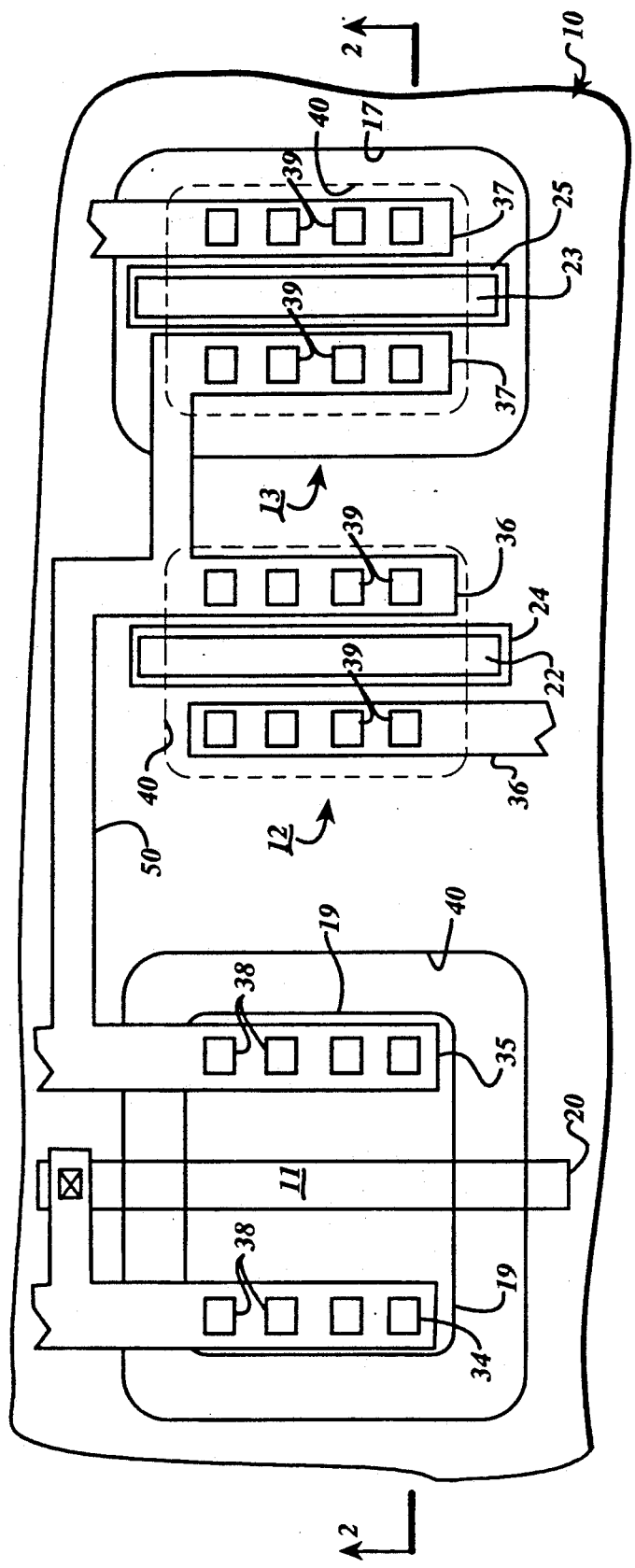
FIG. 2a is a plan view of the device of FIG. 2.

Referring to the circuit diagram of FIG. 1, and the physical structure of FIGS. 2 and 2a, a small part of a CMOS integrated circuit chip 10 constructed according to the invention is shown. This device has an output buffer circuit employing an N-channel ESD protection transistor 11 along with an N-channel pull-down transistor 12 and a P-channel pull-up transistor 13. The chip includes a P+ substrate 14 with a P- epitaxial layer 15. The ESD protection transistor 11 is connected between an output pad 16 and the Vss terminal of the power supply, which is usually connected to the P+ substrate 14. The P-channel transistor 13 as well as other P-channel transistors on the chip are formed in N-wells 17 in the epi layer. Source and drain regions 18 for the N-channel transistor 12 and source and drain regions 19 for the ESD transistor 11 are created by an N+ implant which is driven into the P- epi layer 15 to form shallow N+ areas. This same N+ implant into an N-well is used to create the N-type resistive areas in medium-value precision resistors, according to a feature of the invention disclosed in copending application Ser. No. 515,854, filed Apr. 27, 1990. The ESD protection transistor 11 has a gate 20 spanning the source/drain regions 19. Source and drain regions 21 for the P-channel transistor 13 are created by a P+ implant which is driven into the N-well 17 to form shallow P+ areas. The gate 20 of the ESD protection device 11 and gates 22 and 23 for the transistors 12 and 13 are polysilicon electrodes overlying thin gate oxide and overlying channel regions between the source/drain regions, with the source/drain regions self-aligned with the gates. Sidewall spacers 24 and 25 are used on the sides of the polysilicon gates 22 and 23 to provide a self-alignment feature in creating silicided areas 26 and 27 on the source/drain regions 18 and 21. Silicided areas 28 and 29 are also created on top of the polysilicon gates 22 and 23. However, according to a feature of one embodiment of the invention, the source/drain regions 19 of the device 11 have silicided areas 31 and 32 spaced from the gate 20, but these areas 31 and 32 are not self-aligned with the gate 20, and the top of the gate 20 is not silicided. To this end, an oxide layer 30 on top of the ESD transistor gate 20 and its source/drain regions 19 is created at the same time as the sidewall spacers 24 and 25, and this blocks creation of self-aligned silicided regions close to the gate which otherwise would have been created at the same time as the silicided areas 26, 27, 28 and 29. A low-temperature deposited oxide layer 33 covers the entire face of the wafer after the silicided areas are formed, and vias etched in this oxide layer 33 and through the oxide mask layer 30 allow metal-to-silicide contacts for connections 34 and 35 to the silicided areas 31 and 32 for the source/drain regions 19 of the ESD device 11. Also, of course, metal-to-silicide connections are made by vias for source/drain connections 36 and 37 for the transistors 12 and 13, respectively. The metal connections 34–37 make contact to the silicided areas at contact areas 38 or 39. The areas of the face where the N- and P-channel transistors 12 and 13, and for protection device 11, are delineated on the face of the substrate by high-temperature (thermal) field oxide areas 40. There may be second (or third) level metallization, separated from the first level metal contacts and interconnections 34–37 by interlevel oxide, not shown.

In is important to note that the spacing L between the inner edge of the silicide area 32 and the drain junction of the transistor 11 is wide, much more than the "design rule" of the CMOS process used. The gate 20 is usually one "design rule" wide (width here meaning the source-to-drain distance), perhaps 1-micron, depending upon the fabrication technology, whereas the spacing L should be perhaps 3-micron or more. The purpose for this wide spacing L is to separate the heat-generating area from the material most likely to be fail due to overheating caused by an ESD event. An electrostatic charge of several thousand volts applied to the pad 16 is harmlessly grounded through the device 11, so long as the amount of charge is quite small and the current spike to discharge the electrostatic charge is of short duration. The main area of heating due to the current spike is at the drain junction. The spacing between the silicided areas 31 or 32 and the edge of the field oxide 40 may also advantageously be the length L.

Referring to FIGS. 3–7, a method for manufacturing the device of FIGS. 2 and 2a will be described. These FIGS. 3–7 are at successive stages in the manufacturing process. It is understood that only a very small part of a silicon wafer is shown in these Figures, and the transistors illustrated are merely examples of devices formed in dense circuits having perhaps hundreds of thousands of such components in each chip. There are usually hundreds of such chips in a wafer of perhaps six or eight inch diameter, before breaking into individual units.

Figure 3:
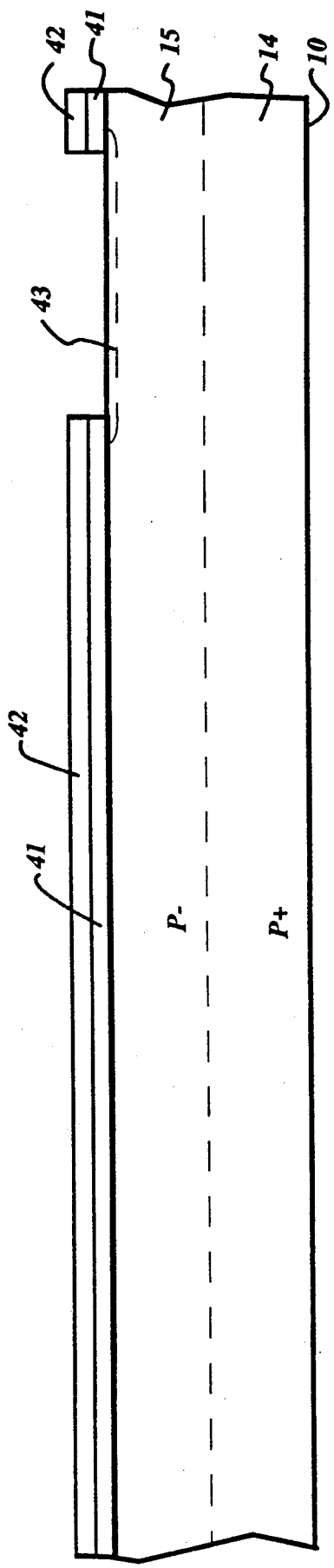
Figure 4:
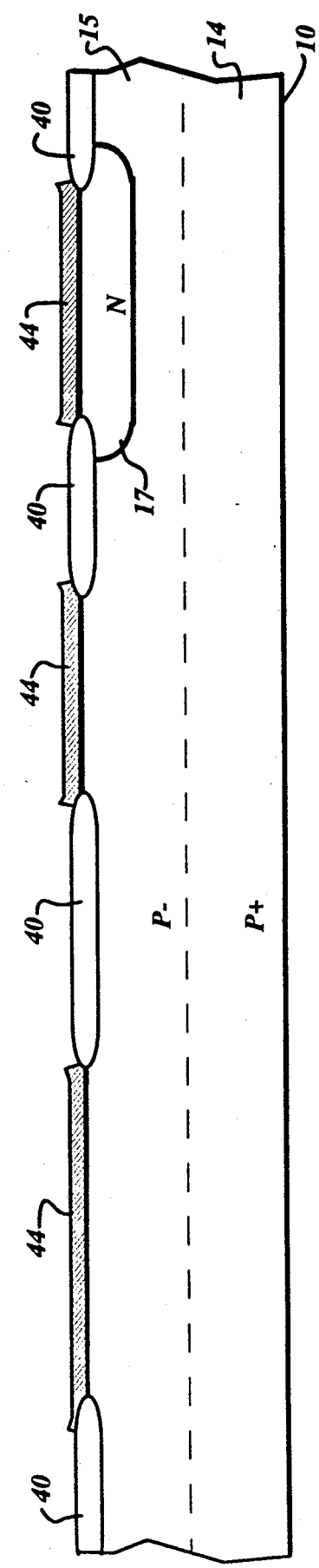
Figure 7:
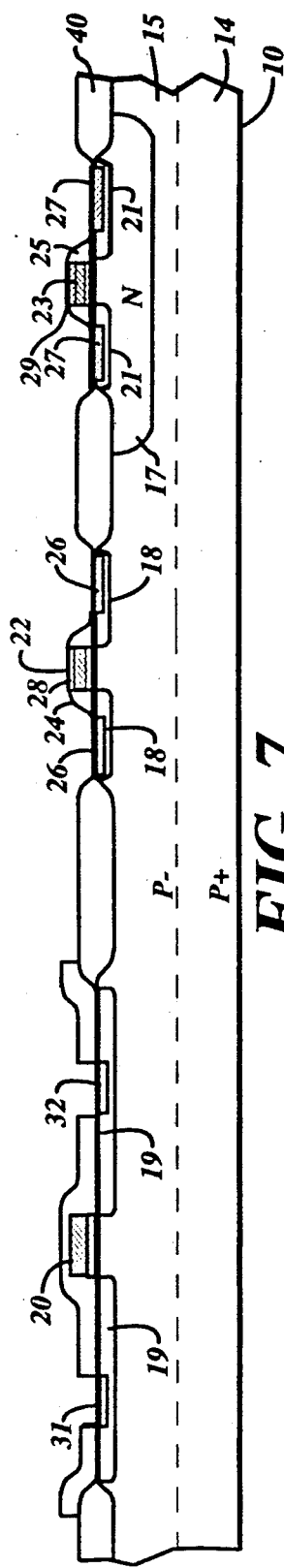
Figure 7A:
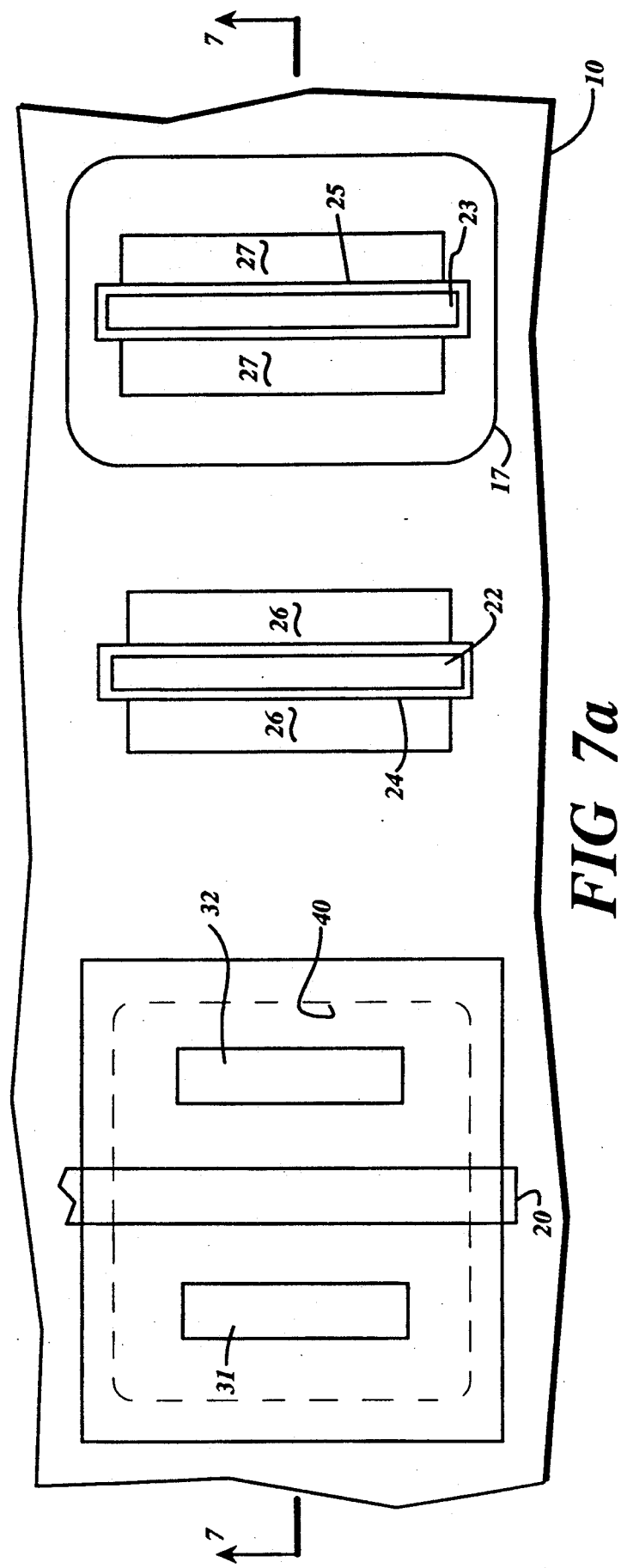

After a thermal oxidation step to create a layer 41 of silicon oxide, a photoresist mask 42 is formed over the areas where N-channel transistors are to be created, as shown in FIG. 3. After an etching step to remove the silicon oxide layer 41 in the unmasked areas, a phosphorus implant is performed to create shallow regions 43 which, when driven into the silicon by subsequent high-temperature steps, creates the N-well 17, as seen in FIG. 4. The field oxide layer 40 is formed by first depositing a layer 44 of silicon nitride over a thin layer of oxide on the epi layer 15 as shown in FIG. 4, then patterning this oxide/nitride layer 44 using a photolithographic masking and etching step to leave oxide/nitride only where the transistors are to be created. The wafer is then subjected to a thermal oxidation step to form the field oxide 40 in areas where the oxide/nitride 44 has been removed. The oxide/nitride layer 44 is stripped off. The next step is forming the gate oxide 45, usually by thermal oxidation, then creating the gates 20, 22 and 23 by depositing a layer of polycrystalline silicon over the entire face of the wafer and patterning the layer using photoresist masking and etching to leave only the gates 20, 22 and 23 (as well as polysilicon interconnects) as seen in FIGS. 5 and 5a. The area of the P-channel transistor 13 is covered by a photoresist mask, and an arsenic implant is performed at this point, using the polysilicon gates 20 and 22 as a mask to create the N+ source/drain regions 18 and 19. The photoresist mask is stripped, then the area of the transistor 11 and that of the N-channel transistor 12 are covered by another photoresist mask and a P+ implant done to create the source/drain regions 21 for the P-channel transistor 13. The face of the wafer is next covered with a conformal coating 46 of low-temperature deposited oxide to be used in creating the sidewall spacers 24 and 25. This oxide is also used to prevent the formation of silicide on the protection transistor 11, and to this end a mask 47 of photoresist is formed over the area which is to become this transistor. This mask 47 is formed by depositing photoresist over the entire top surface of the oxide 46, then exposing to light through a mask prepared for solely the purpose of defining this protection transistor mask. Vias for siliciding areas spaced away from the gate 20 are left in this mask 47. This photoresist mask and etch step (and subsequent removal of the mask 47) is the only manufacturing step added to a standard CMOS process to produce the non-silicided protection transistors of the invention, since all of the other steps in this method are already present in an N-well CMOS process using sidewall spacers and self-aligned silicided source/drain regions. These added steps, forming the mask 47 and then removing this mask, require no critical alignment with other geometry of the face of the wafer, since the overlap onto the field oxide 40 and other features tolerate considerable misalignment. A directional etch such as a reactive ion etch is used to remove all of the deposited oxide layer 46 in the areas of the face not covered by the mask 47, but since only a given amount of oxide is removed in this step the sidewall spacers 24 and 25 are left where the thickness has built up near the vertical step of the polysilicon gates 22 and 23, seen in FIGS. 6 and 6a. The next step is forming the silicided areas 26, 27, 28 and 29, as seen in FIG. 7, and this is accomplished by first stripping off the mask 47 then depositing a thin layer of titanium over the entire top surface of the wafer, followed by a heat treatment which forms the silicide by reaction of the metal with the silicon where the silicon is bare; in areas covered by oxide the metal does not react and is subsequently removed by cleaning. The silicide thus forms on the tops of the polysilicon gates 22 and 23, and on the source/drain regions of the transistors 12 and 13, but not on the polysilicon gate 20. The siliciding produced on the source/drain regions 19 at areas 31 and 32 is spaced from the gate 20 by the distance L. After the self-aligned silicide areas are created, the entire top surface of the wafer is coated with the low-temperature deposited oxide 33 as seen in FIG. 2, and a photoresist masking and etching step is performed to open the vias where contact is to be made to the silicided areas at contact areas 38 and 39. The metallization layer for contacts and interconnects is then formed by first laying down a coating of a metal, e.g., aluminum, and patterning this metal layer using photoresist masking and etching to leave the contacts 34, 35 36 and 37, seen in FIGS. 2 and 2a.

Figure 8:
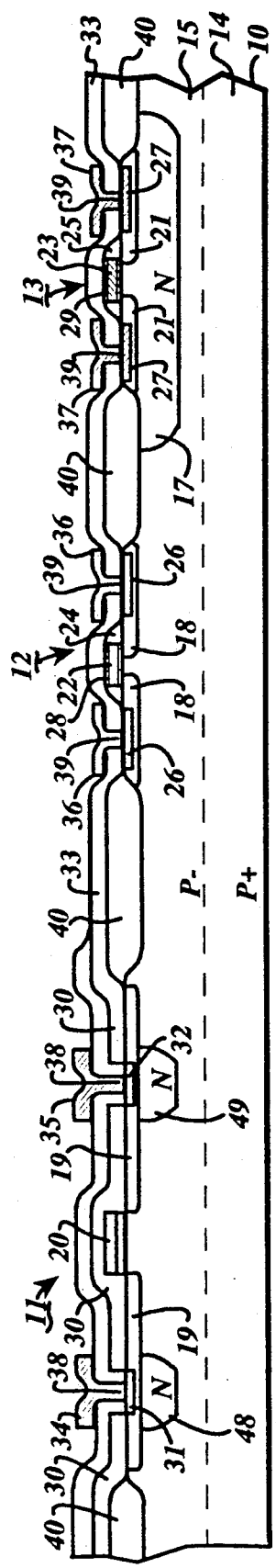
FIG. 8 is an elevation view in section of a small part of a semiconductor integrated circuit containing an ESD protection device according to another embodiment of the invention, generally according to FIG. 2.

In another embodiment of the invention, as illustrated in FIGS. 8 and 8a, the N-wells created every where a P-channel transistor is to be formed are also placed under the silicide areas 31 and 32 of the protection transistor 11. These N-wells 48 and 49 are created at the same time as the N-well 17, and merely require vias to be left in the mask 42 of FIG. 4 of the same size and at the same positions as the areas 31 and 32 which are to be formed later. Other than the shape of the mask 42 over the protection device area to create these N-wells 48 and 49, the process of making the device of FIG. 8 is the same as that of FIGS. 1–7. The N-wells 48 and 49 circumvent the possibilities of failures due to the N+ junction of source/drain regions 19 being not much deeper than the silicide areas 31 and 32. The use of these N-wells would not normally be possible, since the well regions from source and drain would interact, being too close to one another. However, the spacing L between the gate 20 and the silicide areas 31 and 32, allowing the silicide edge to be moved as far away from the poly edge as required on both source and drain side, has the added benefit of allowing wells to be placed under the silicide without interacting.

The circuit of FIG. 1 shows the protection device 11 having its source/drain path connected directly to a node 50 at the juncture of the transistors 12 and 13, so the two transistors 11 and 12 provide parallel paths to Vss from the pad 16 or node 50. To make sure that the lowest resistance path for an ESD event at pad 16 is the protection device 11 (instead of the transistor 12), a series resistor (not shown) may be placed in line between the node 50 and the drain of the transistor 11. Alternatively, the width of the gate 22 (length of the source-to-drain path) may be made longer than the width of the gate 20; for example, the width of gate 20 may be 1-micron and the width of gate 22 1.5-micron.

The improved protection transistors of the invention as described above are thus seen to be manufactured by a process compatible with a standard CMOS process, without adding any process steps requiring critical alignment.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. An integrated circuit device comprising:
   (a) at least one transistor having source/drain regions formed in a face of a semiconductor body and having a gate on said face;
   (b) sidewall spacers on sidewalls of said gate and formed of a deposited oxide;
   (c) said transistor having source and drain regions in said face and having silicided areas of said face on said source and drain regions, said silicided areas being self-aligned with said sidewall spacers;
   (d) an ESD protection device at said face, said protection device including a gate and including source and drain regions of the same type as said source/drain regions of said transistor, and a masking layer of said deposited oxide over said gate and over said source and drain regions adjacent said gate of said protection device, said ESD protection device not having silicided areas at said face on said gate or on said source and drain regions adjacent said gate.

2. An integrated circuit device according to claim 1 wherein said at least one transistor includes at least one N-channel MOS transistor and at least one P-channel MOS transistor.

3. An integrated circuit device according to claim 1 wherein said source and drain regions of said ESD protection device are N-type and formed in a P-type semiconductor body.

4. An integrated circuit device according to claim 3 wherein said integrated circuit device includes both P-channel and N-channel MOS transistors formed at said face.

5. An integrated circuit device according to claim 1 wherein said ESD protection device has silicided areas on said source and drain regions, said silicided areas being spaced from said gate by a distance greater than the width of said gate of said ESD protection device.

6. An integrated circuit device according to claim 5 including metal-to-silicide contacts to said silicided areas of said source and drain regions of said ESD protection device.

7. An output buffer having electrostatic protection and formed as an integrated circuit device, comprising:
   (a) an N-channel pull-down transistor having a source-to-drain path and a P-channel pull-up transistor having a source-to-drain path, said source-to-drain paths of said transistors being connected in series and the series source-to-drain paths being connected across a voltage supply, the voltage supply having a reference terminal and a voltage terminal;

(b) an output pad connected to a juncture of said series source-to-drain paths of said transistors;
(c) a N-channel protection transistor having a source-to-drain path, said source-to-drain path of said protection transistor being connected between said output pad and said reference terminal of said voltage supply and having a gate connected to said reference terminal;
(d) said pull-up transistor having a silicided polysilicon gate and having self-aligned silicided areas on source and drain regions closely adjacent said silicided polysilicon gate but spaced therefrom by sidewall spacers; and said pull-down transistor having a silicided polysilicon gate and having self-aligned silicided areas on source and drain regions closely adjacent said silicided polysilicon gate but spaced therefrom by sidewall spacers;
(e) said protection transistor having a non-silicided polysilicon gate and having source and drain regions with no self-aligned silicide thereon.

8. A device according to claim 7 wherein said source and drain regions of said protection transistor have non-self-aligned silicide areas thereon spaced from said non-silicided polysilicon gate of said protection transistor by greater than the width of said polysilicon gate of said protection transistor.

9. A device according to claim 7 wherein said output pad is connected to said juncture by resistive means.

* * * * *